United States Patent
Ozcan et al.

(10) Patent No.: US 11,645,206 B2
(45) Date of Patent: May 9, 2023

(54) DISTRIBUTED MEMORY-AUGMENTED NEURAL NETWORK ARCHITECTURE

(71) Applicant: International Business Machines Corporation, Armonk, NY (US)

(72) Inventors: Ahmet Serkan Ozcan, Los Altos, CA (US); Tomasz Kornuta, Los Gatos, CA (US); Carl Radens, LaGrangeville, NY (US); Nicolas Antoine, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/472,764

(22) Filed: Sep. 13, 2021

(65) Prior Publication Data

US 2021/0406181 A1 Dec. 30, 2021

Related U.S. Application Data

(62) Division of application No. 16/838,294, filed on Apr. 2, 2020, now Pat. No. 11,176,043.

(51) Int. Cl.
*G06F 16/00* (2019.01)
*G06F 16/2453* (2019.01)
(Continued)

(52) U.S. Cl.
CPC ...... *G06F 12/0824* (2013.01); *G06F 12/0246* (2013.01); *G06F 16/3347* (2019.01);
(Continued)

(58) Field of Classification Search
CPC ............ G06F 12/0824; G06F 16/3347; G06F 12/0246; G06F 16/2458; G06F 16/24545;
(Continued)

(56) References Cited

U.S. PATENT DOCUMENTS

| 10,042,804 B2 | 8/2018 | Watson, Jr. et al. |
| 10,410,119 B2 | 9/2019 | Grefenstette et al. |

(Continued)

OTHER PUBLICATIONS

Graves et al., "Hybrid computing using a neural network with dynamic external memory," 2016, vol. 000, doi:10.1038/Nature 20101, 21 pages.

(Continued)

*Primary Examiner* — Ly D Pham
(74) *Attorney, Agent, or Firm* — Cantor Colburn LLP; Daniel Yeates

(57) ABSTRACT

A method for using a distributed memory device in a memory augmented neural network system includes receiving, by a controller, an input query to access data stored in the distributed memory device, the distributed memory device comprising a plurality of memory banks. The method further includes determining, by the controller, a memory bank selector that identifies a memory bank from the distributed memory device for memory access, wherein the memory bank selector is determined based on a type of workload associated with the input query. The method further includes computing, by the controller and by using content based access, a memory address in the identified memory bank. The method further includes generating, by the controller, an output in response to the input query by accessing the memory address.

20 Claims, 9 Drawing Sheets

(51) Int. Cl.

| | |
|---|---|
| *G06F 12/02* | (2006.01) |
| *G06F 12/0817* | (2016.01) |
| *G06F 16/33* | (2019.01) |
| *G06N 3/063* | (2023.01) |
| *G11C 11/4076* | (2006.01) |
| *G11C 11/4093* | (2006.01) |
| *G06F 16/2458* | (2019.01) |
| *G06F 12/06* | (2006.01) |
| *G06F 3/06* | (2006.01) |

(52) U.S. Cl.
CPC .......... *G06N 3/063* (2013.01); *G11C 11/4076* (2013.01); *G11C 11/4093* (2013.01); *G06F 3/067* (2013.01); *G06F 12/06* (2013.01); *G06F 16/2458* (2019.01); *G06F 16/24545* (2019.01)

(58) Field of Classification Search
CPC ......... G06F 3/067; G06F 12/06; G06N 3/063; G11C 11/4076; G11C 11/4093
USPC ........................................................ 711/154
See application file for complete search history.

(56) References Cited

U.S. PATENT DOCUMENTS

| | | | |
|---|---|---|---|
| 10,496,286 B2 | 12/2019 | Zawodny et al. | |
| 10,942,923 B1 | 3/2021 | Zhang et al. | |
| 11,275,661 B1* | 3/2022 | Vantrease | G06F 11/2242 |
| 11,468,299 B2* | 10/2022 | Van Der Made | G06N 3/045 |
| 2006/0190425 A1 | 8/2006 | Chang et al. | |
| 2007/0038798 A1 | 2/2007 | Bouchard et al. | |
| 2014/0269718 A1 | 9/2014 | Goyal et al. | |
| 2014/0304491 A1* | 10/2014 | Kasahara | G06F 9/38 712/42 |
| 2019/0129858 A1* | 5/2019 | Liu | G06N 3/02 |
| 2019/0324759 A1 | 10/2019 | Yang et al. | |
| 2020/0004685 A1 | 1/2020 | Bernat et al. | |
| 2020/0008299 A1 | 1/2020 | Tran et al. | |
| 2021/0064246 A1* | 3/2021 | Troia | G06N 3/04 |
| 2021/0073219 A1 | 3/2021 | Barbas et al. | |
| 2021/0209455 A1* | 7/2021 | Song | G06N 3/063 |
| 2022/0066943 A1* | 3/2022 | Youn | G11C 11/4076 |
| 2022/0092422 A1* | 3/2022 | Lea | G11C 11/54 |
| 2022/0164297 A1* | 5/2022 | Sity | G06F 15/786 |

OTHER PUBLICATIONS

Graves et al., "Neural Turing Machines," arXiv:1410.5401v2 [cs.NE], Dec. 10, 2014, 26 pages.

IBM: List of IBM Patents or Patent Applications Treated as Related (Appendix P); Date Filed: Sep. 13, 2021; 2 pages.

Khan et al., "Memory Augmented Control Networks," arXiv preprint arXiv:1709.05706, 2017, 19 pages.

Munkhdalai et al., "Metalearned Neural Memory," Advances in Neural Information Processing Systems, 2019, pp. 13310-13321.

Ozcan et al., "Distributed Memory-Augmented Neural Network Architecture," U.S. Appl. No. 16/838,294, filed Apr. 2, 2020.

* cited by examiner

DISTRIBUTED MEMORY-AUGMENTED NEURAL NETWORK ARCHITECTURE

BACKGROUND

The present invention relates to testing of a computer technology and, more specifically, to a distributed memory architecture.

Artificial neural networks (ANNs), such as deep neural networks have had a revolutionary impact on the field of computing technology, particularly, artificial intelligence. ANNs have facilitated achieving improved performance as well as results on tasks such as image recognition, speech recognition, translation, image captioning, etc. This, in turn, has resulted in efforts directed towards the design of accelerators for both an inference phase and a training phase of an ANN. ANNs, typically, handle large volumes of data during training as well as during inference. Hence, the ANNs can require memory devices that facilitate handling storage and retrieval of such large volumes of data in an efficient manner.

SUMMARY

According to one or more embodiments of the present invention, a method for using a distributed memory device in a memory augmented neural network system includes receiving, by a controller, an input query to access data stored in the distributed memory device, the distributed memory device comprising a plurality of memory banks. The method further includes determining, by the controller, a memory bank selector that identifies a memory bank from the distributed memory device for memory access, wherein the memory bank selector is determined based on a type of workload associated with the input query. The method further includes computing, by the controller and by using content based access, a memory address in the identified memory bank. The method further includes generating, by the controller, an output in response to the input query by accessing the memory address.

According to one or more embodiments of the present invention, a neural network system, includes a distributed memory device with several memory banks, and a controller coupled with the distributed memory device. The controller performs a method to access data stored in the distributed memory device. The method includes receiving an input query to access data stored in the distributed memory device. The method further includes determining a memory bank selector that identifies a memory bank from the distributed memory device for memory access, wherein the memory bank selector is determined based on a type of workload associated with the input query. The method further includes computing, by using content based access, a memory address in the identified memory bank. The method further includes generating an output in response to the input query by accessing the memory address.

According to one or more embodiments of the present invention, a memory address determination apparatus includes a selection unit, and a weighting unit. The memory address determination apparatus performs a method to access data stored in a distributed memory device. The method includes receiving, by the selection unit, a memory bank selector that identifies a memory bank from the distributed memory device for a memory access. The memory bank selector is determined based on a type of workload associated with an input query received by a controller of a neural network. The method further includes, computing, by the weighting unit, a memory address, using content based access, in the memory bank identified. The memory address is used to access data from the distributed memory to generate an output in response to the input query.

According to one or more embodiments of the present invention, a computer-implemented method includes receiving, by a controller neural network, an input. The method further includes generating, by the controller neural network, parameters including (i) a key vector and (ii) a selector vector to interface with several memory banks that are in communication with the controller neural network via a memory subsystem. The method further includes selecting, by the memory subsystem, at least one of the memory banks for the controller neural network to access, using the selector vector and the key vector. The method further includes accessing, by the controller neural network, a memory address from the selected memory bank using the key vector.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

DETAILED DESCRIPTION

Embodiments of the present invention facilitate improvements to computing technology, and particularly neural networks, by providing technical features to implement a distributed memory architecture when using memory-augmented neural networks (MANN), such as a neural turing machine (NTM). MANNs are a class of recurrent neural network (RNN) that separate computation from memory. The key distinction between MANNs and other RNNs such as long short-term memory cells (LSTM) is the existence of an external memory unit. A controller network in the MANN receives input, interacts with the external memory unit via read and write heads and produces output.

Figure 1:
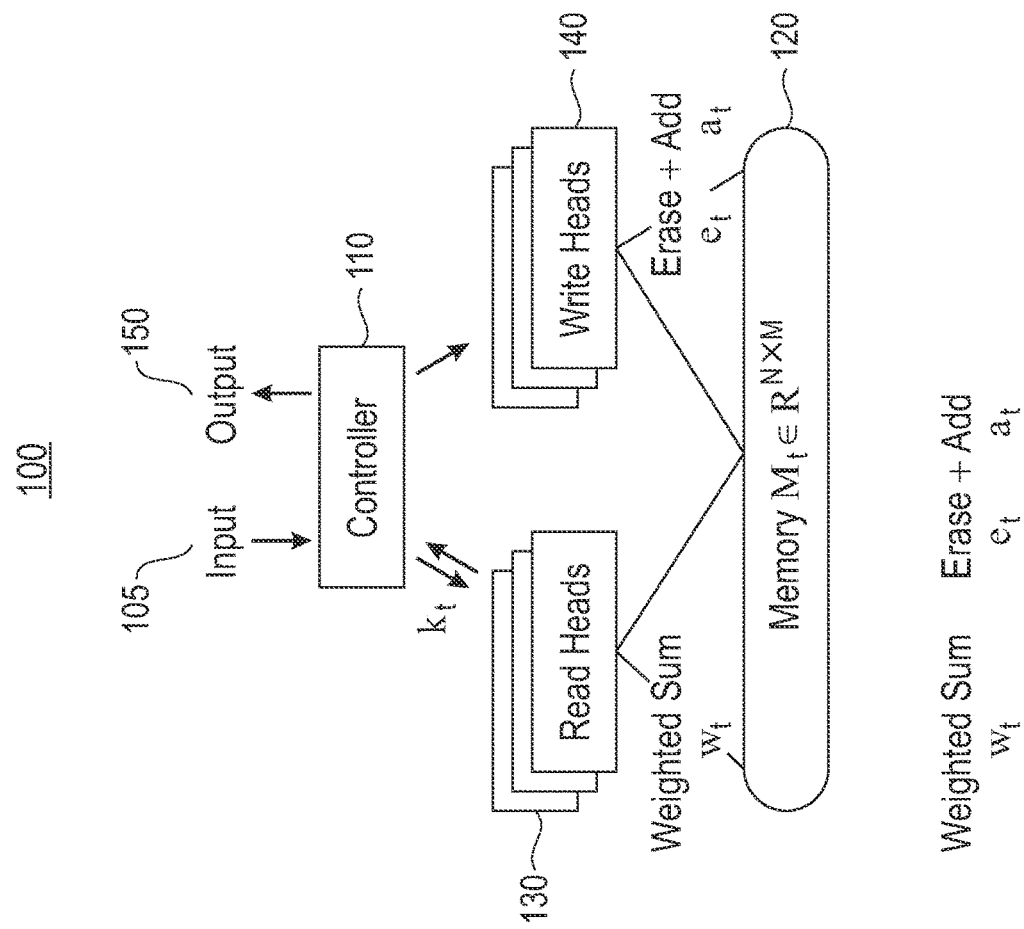
FIG. 1 depicts a block diagram of a memory augmented neural network (MANN) using neural training machine addressing techniques.

FIG. 1 depicts a block diagram of a MANN using neural training machine addressing techniques. The MANN 100 uses content-based addressing in which values are selected from a contiguous memory device 120 based on similarity with an input query 105. The MANN includes a controller 110, which is a neural network that receives the input query 105. The input query 105 can be a sequence of one or more attributes. The input query 105 can include a request to read or write data to the memory device 120. The controller 110 can be a feed forward neural network, an RNN, or any other such neural network that reads and writes to the memory device 120. Based on the interaction with the memory device 120, and the input query 105, the controller 110 provides an output 150. For example, the output 150 can include data values read from the memory device 120 in response to the input query 105. Alternatively, in the case that the input query 105 includes a request to write data values, the output 150 can include a confirmation of the write operation, and/or a memory address where the write operation was performed, or any other such response.

The controller 110 generates and emits parameters (kt) to a read head 130 and/or to the write head 140. The read head 130 determines the address from which values are read from the memory device 120. The write head 140 determines the address to which the values are stored into the memory device 120. In one or more embodiments of the present invention, the read head 130 generates a distribution of weights to access the memory device 120 and read from a location. In one or more embodiments of the present invention, the write head 140 can erase and add new vectors to the memory device 120. In one or more embodiments of the present invention, the read head 130 and the write head 140 are memory pointers containing addresses of the memory device 120 from which the data values are to be read, or written into.

In the present solutions, the memory device 120 is a single contiguous memory that includes multiple memory locations that are accessed using a 2-dimensional matrix representation. The memory location that the input query 105 accesses is determined by a weight vector associated with the controller 110. The weight vector is normalized so that its value ranges from zero to one and the sum of the weight vector equals one. Accordingly, consider a normalized weight vector $w_t$ where t denotes time and $w_t(i)$ denotes an element in the weight vector at an index i and time t. Further, consider that the memory locations in the memory device 120 are represented as a matrix $\mathcal{M}$ with N rows and M columns and $\mathcal{M}_t$ represents the memory matrix at the time t. In other words, $\mathcal{M}_t$ is a snapshot of the memory contents at time t.

When reading from the memory device 120, the memory matrix $\mathcal{M}_t$ is combined with the weight vector $w_t$ to determine a read vector $r_t$ at time t in a linear way. This can be expressed as:

$$r_t = \sum_i w_t(i)\mathcal{M}_t(i)$$

The read vector $r_t$ represents the memory addresses from which the data values are read as part of the output 150.

Writing to the memory device 120 can include erasing and adding content to the memory device 120. Erase operation can be applied to remove information that is not required in the memory device 120. To erase the value of particular cell(s) in the memory matrix, an erase vector $e_t$ is used. The erase vector has the same length as the weight vector $w_t$. Typically, the erase vector contains values from 0 and 1. To erase values and to get an updated memory matrix $\mathcal{M}_t^*$ at time t, the memory matrix $\mathcal{M}_{t-1}$ from the most recent time t−1 is combined with a result of multiplication of the weight vector and the erase vector as follows:

$$\mathcal{M}_t^*(i) = \mathcal{M}_{t-1}(i) \cdot (1 - w_t(i)e_t)$$

Storing content into the memory cells uses the weight vector and an add vector $a_t$ which lists the values that are to be added into the memory locations. The memory matrix $\mathcal{M}_t^*$ is first determined using the erase operation, and then the new data values are added into the memory device 120 by determining an updated memory matrix $\mathcal{M}_t$ at time t using:

$$\mathcal{M}_t(i) = \mathcal{M}_t^*(i) + w_t(i)a_t$$

As can be seen, the addressing for both the reading and writing operations depends on the weight vector that the controller 110 determines. The controller 110 can use attention network calculation and different addressing schemes to compute the weight vector. For the content-based addressing, values selected from the memory device 120 are based on similarity to the data values in the input query 105. Consider that the controller 110 determines a key vector $k_t$ that is used to compare with each memory vector $\mathcal{M}_t(i)$ to determine a similarity. The similarity can be measured using various techniques, for example, a cosine similarity can be computed. It is understood that other similarity functions K can be used in one or more embodiments of the present invention.

Accordingly, the weight vector is computed in present solutions as:

$$w_t(i) = \frac{\exp(\beta_t \cdot K[k_t, \mathcal{M}_t(i)])}{\sum_j \exp(\beta_t \cdot K[k_t, \mathcal{M}_t(j)])}$$

Here, β represents a key strength that determines a concentration of the weight vector, and it is a predetermined vector that a user can configure prior to or during runtime. Based on the value of β, the controller 110 tunes attention to a particular location in the memory device 120. For example, when the value of β is low, the controller 110 can focus on all the locations equally, and when the β is high, the controller 110 can focus on a particular location(s). The β can be accordingly varied if the data values are to be retrieved/stored by the controller 110, in particular parts of the memory device 120.

A technical challenge with such existing solutions is that the memory device 120 is restricted to a particular size. This is because in case the memory device 120 is too large, the matrix multiplications and other matrix calculations noted above can take time, and also additional resources. This can increase the time required to access the memory locations, and in turn the data values in the memory device 120. For faster access to memory, smaller sized memory devices 120 can be used, which then limits the memory size, and in turn, the operations that can be performed by the MANN 100. Technical solutions provided by one or more embodiments of the present invention address such technical challenges by facilitating the controller 110 to operate a memory bank that includes several memory matrices $\mathcal{M}_t$.

Figure 2:
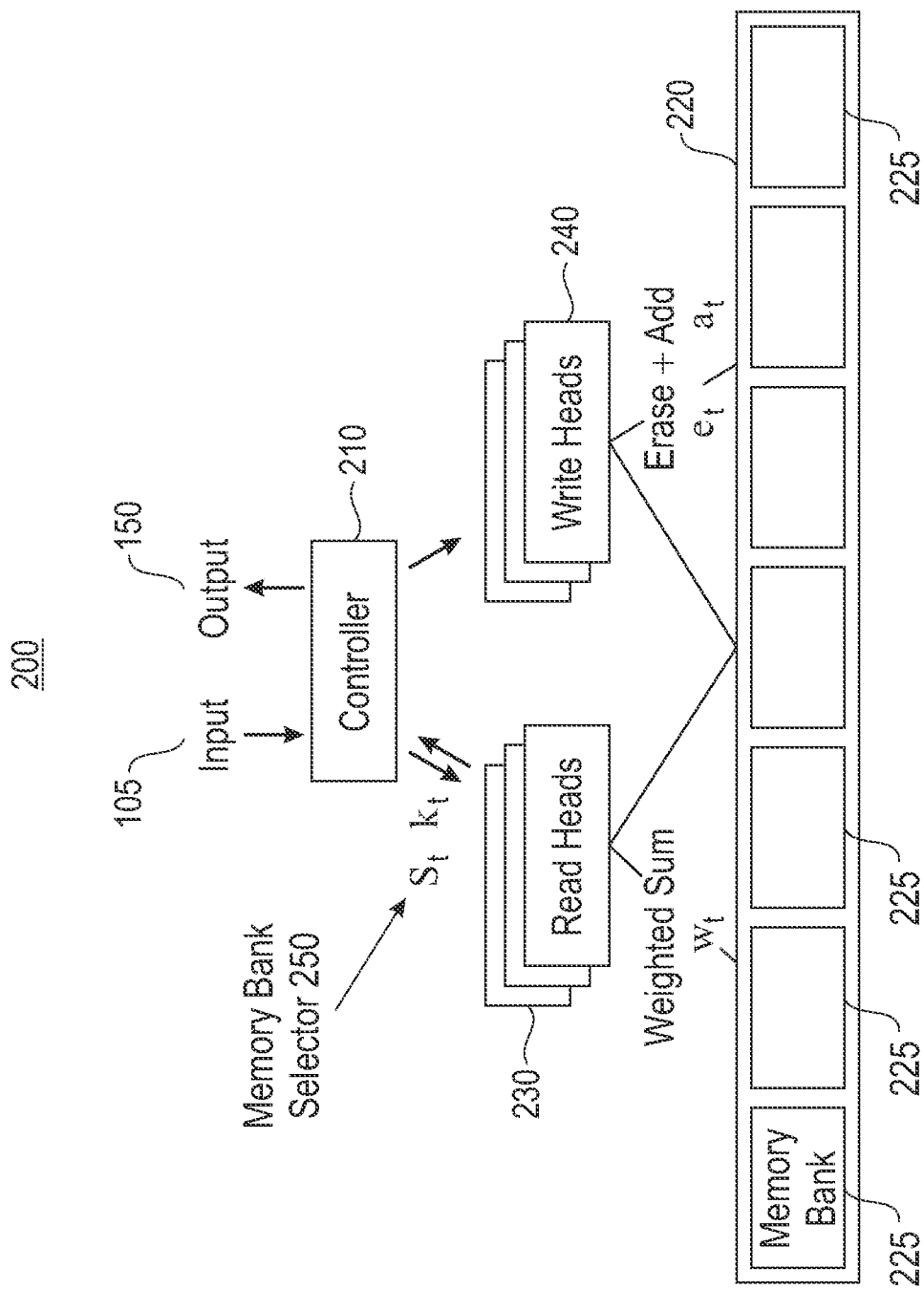
FIG. 2 depicts a block diagram of a MANN using a memory device that includes several memory banks according to one or more embodiments of the present invention.

FIG. 2 depicts a block diagram of a MANN using a memory device that includes several memory banks according to one or more embodiments of the present invention. The MANN 200 according to one or more embodiments of the present invention includes a controller 210 that receives the input query 105 and provides the output 150 in response. The controller 210 can be a neural network that determines the key vector $k_t$ that is used by read heads 230 and write heads 240 to access the memory locations. In addition to the key vector, the controller 210 determines a memory bank selector 250 ($s_t$).

The memory bank selector 250 is used to select one of several memory banks 225 from the memory device 220 that is a distributed memory device. In the distributed memory device 220, the memory banks 225 are implemented as individual matrices. Accordingly, a memory location 1 in each memory bank 225 represents a separate memory location. The memory bank selector 250 is a trainable parameter, which the read head 230 and the write head 240 use to select a particular memory bank 225 to read and write, respectively. The memory bank selector 250 can be, or can produce at least one of the following: preferred biases, circuit timings, stability and/or write assist parameters for the memory banks 225. The addressing operation is limited to the selected memory bank 225, rather than the whole memory device 220, accordingly making the address computations more manageable and efficient. Accordingly, embodiments of the present invention provide an improvement to computing technology by facilitating the MANN 200 to use large sized memory devices 220 that include several memory banks 225, each representing independent memory matrices $\mathcal{M}_t$. Alternatively, or in addition, by facilitating such independent memory matrices in the memory device 220, the address computations can be performed more efficiently than existing solutions. Accordingly, embodiments of the present invention provide an improvement to existing computing technology, particularly MANNs. Such technical improvements provide a practical application that can be used for several technical fields such as image recognition, audio recognition, handwriting recognition, economic analysis, and several other fields where MANNs can be used.

Each memory bank 225 can be a separate memory hardware in one or more embodiments of the present invention. For example, the separate memory banks 225 can be different physical types of memory with attributes such as high-density, fast write, fast read, latency, low standby power, endurance, non-volatility and other such attributes. The memory banks 225 can be a combination of static random access memory (SRAM), register files, dynamic random access memory (DRAM), flash memory, resistive random access memory (RRAM), magnetoresistive RAM (MRAM), ferroelectric RAM (FeRAM) and other types of memory.

Alternatively, or in addition, each memory bank 225 can be a partition in a single memory hardware. Alternatively still, the memory banks 225 can be formed by a combination of multiple memory hardware, each including multiple memory banks 225 as separate partitions.

The memory bank selector 250 is trained to select a memory bank 225 from the distributed memory device 220 trainable selector to steer content based on type of computational work to be performed such as maximized model size with dense memory, fast operation, power conservation, etc. Based on the type of computation to be performed, the controller 210 determines the memory bank(s) 225 to be used for storing/retrieving data.

Alternatively, the distributed memory device 220 includes homogenous set of memory banks 225. In such cases, the controller 210 is trained to dynamically select the memory bank(s) 225 to be used based on biases, preferred circuit timings, or desired attributes such as access disturb stability, low-voltage write margin, and low standby power, and the like or a combination thereof. In one or more embodiments of the present invention, the trainable selector 250 facilitates the controller 210 to configure selected bias, implementation of read stability assist or write assist, or preferred circuit timing based on type of computational work to be performed.

Accordingly, in one or more embodiments of the present invention, the distributed memory device 220 includes a heterogeneous combination of memory banks 225, the memory banks 225 having different types of attributes that are advantageous for different types of computational work. In one or more embodiments of the present invention, the distributed memory device 220 includes homogenous combination of memory banks 225, where the memory banks 225 have a common set of attributes. The memory bank selector 250 produces allocation of memory type based on training and/or type of workload associated with an incoming input query 105. The memory bank selector 250 produces preferred bias or circuit timings, or sets stability assist or write assist parameters for memory banks 225 based on training and/or the type of workload.

Figure 3:
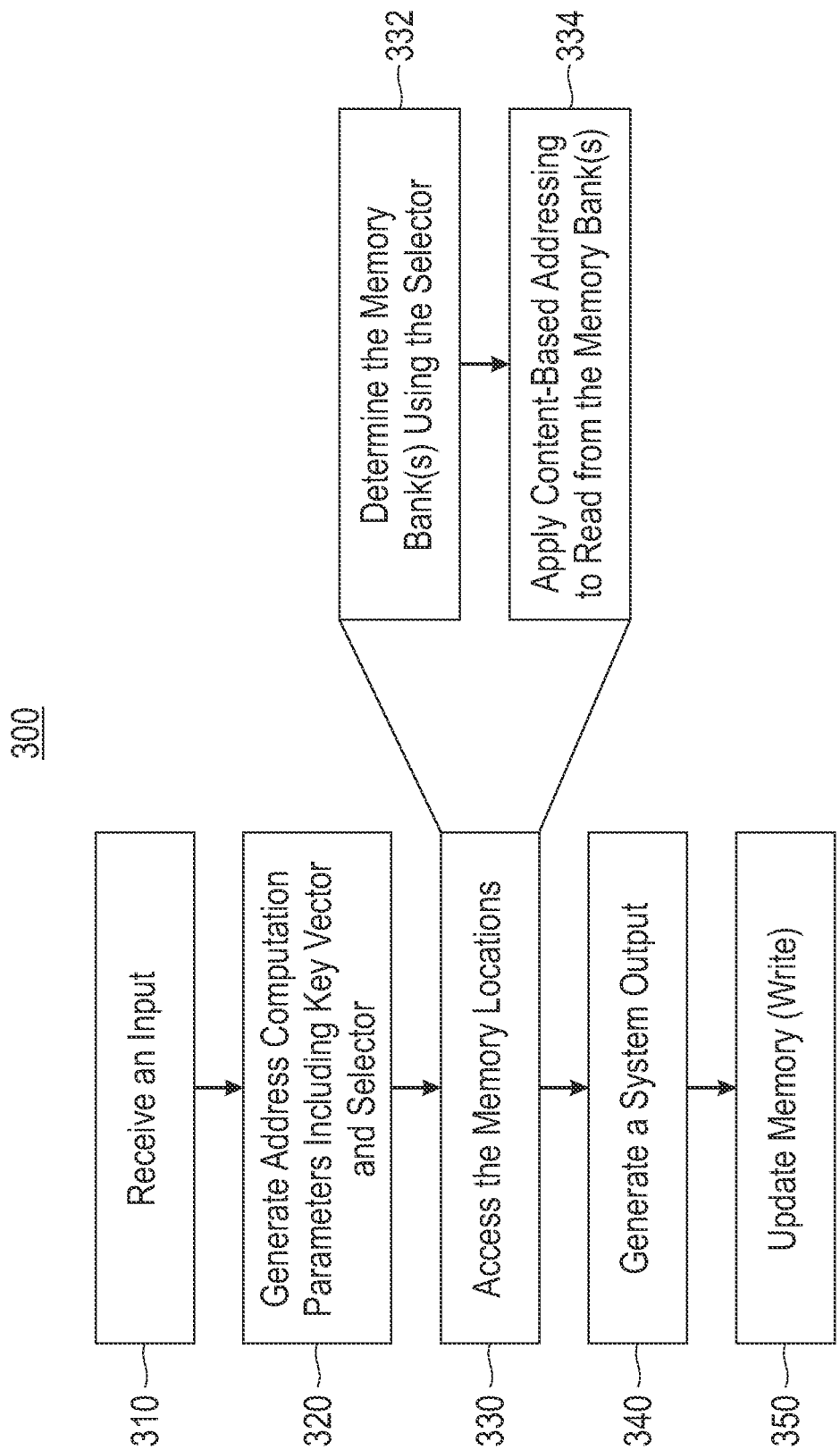
FIG. 3 depicts a flowchart of a method for memory access in a MANN using several memory banks according to one or more embodiments of the present invention.

FIG. 3 depicts a flowchart of a method for memory access in a MANN using several memory banks according to one or more embodiments of the present invention. The method 300 includes receiving the input query 105, at block 310. The input query 105 either includes data values that can trigger either a read or a write operation at the memory device 220.

The method 300 further includes generating address computation parameters including the key vector and the memory bank selector 250 by the controller 210, at block 320. The controller 210 is trained to determine the key vector and the selector 250 using feed forward training, or any other type of training techniques for a neural network. Accordingly, given the input query 105, the controller 210 outputs the key vector and the memory bank selector 250 using inference. In one or more embodiments of the present invention, the memory bank selector 250 is a vector of length equal to the number of memory banks 225 in the distributed memory device 220.

Further, the method 300 includes using the parameters determined by the controller 210 to access the memory locations in the distributed memory device 220, at block 330. Accessing the memory locations includes determining the memory bank(s) 225 using the selector 250, at block 332.

As described herein, the selector 250 selects one or more memory banks 225 based on training and a type of workload in the input query 105. Accordingly, the controller 210 determines the type of workload caused by the input query 105. A type of workload can be selected from a list of predetermined types of workloads to which the controller 110 refers. This can be a classification of the input query 105 performed by the controller 210 based on training. Each type of workload is assigned to a particular set of memory banks 225. For example, in cases where computation time required for the query is short, a set of memory banks 225 with lower latency may be selected so that the computations are not stalled for memory access. Alternatively, or in addition, if the workload is computationally expensive, a particular set of memory banks 225 with higher latency may be used because the memory access can take slightly longer time as the computations are being performed. Alternatively, or in addition, other criteria can be used for selecting the memory banks 225, such as power consumption, data distribution, and the like.

Further, once the memory bank(s) 225 are selected, content-based addressing is used to read from the selected memory bank(s) 225, at block 334.

Figure 4:
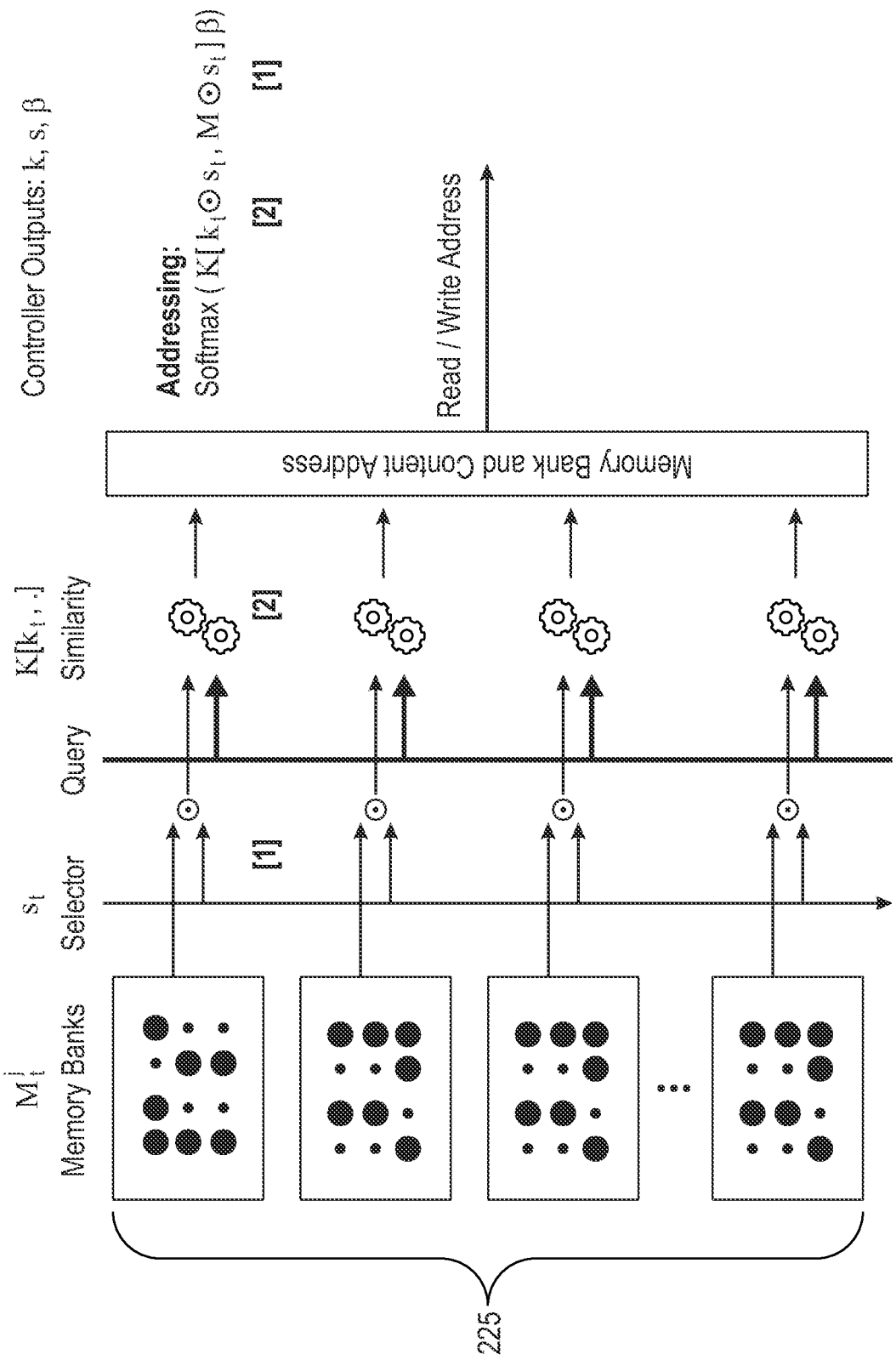
FIG. 4 depicts a block diagram of the memory bank selection and addressing, according to one or more embodiments of the present invention.

FIG. 4 depicts a block diagram of the memory bank selection and addressing according to one or more embodiments of the present invention. The memory banks 225 are shown at time t, the representation of each memory bank 225 being a matrix $\mathcal{M}_t$. The read head 230 and/or the write head 240 selects a memory bank 225 by performing a selector operation (represented as "[1]"), which is a dot product of the memory bank selector 250 ($s_t$) and the memory banks 225. Further, the input query 110 and the key vector ($k_t$) are used to compute the similarity function (which can include one or more dot product). The similarity function computation is depicted as "[2]." After these operations are completed for all memory banks 225 in parallel, the output is the read/write address that can be used to access the memory locations for the input query 105.

The calculations in equation form can be depicted as:

$$\text{Softmax}(K[k_t \odot s_t, \mathcal{M}_t \odot s_t] \cdot \beta)$$

Here, softmax function, is a function that takes as input a vector of n real numbers, and normalizes it into a probability distribution consisting of n probabilities proportional to the exponentials of the input numbers. That is, prior to applying softmax, some vector components could be negative, or greater than one; and might not sum to 1; but after applying softmax, each component will be in the interval (0,1), and the components will add up to 1, so that they can be interpreted as probabilities. Here, the output of the softmax function represents the memory address that is to be accessed for the input query 105. In one or more embodiments of the present invention, the memory addresses generated in this manner are "soft addresses", i.e., the memory address is not a single index/address, but a distribution over the memory addresses in the memory device 120.

Referring back to the flowchart from FIG. 3, the computed memory address is accessed and the data value is output as is commanded by the input query 105, at block 340. Further, if commanded by the input query 105, the memory address is written to, at block 350. In one or more embodiments of the present invention, a memory update is performed in two steps: (i) erase; and (ii) add, both of which are described herein. In one or more embodiments of the present invention, both steps use the same memory addressing techniques. In some cases, the two steps can use different memory addresses $w_t$, one to erase existing data, and another to add new data from the input query 105.

Accordingly, the method 300 facilitates the MANN 200 to use the distributed memory device 220 to read/write data into independent memory banks 225 in an efficient manner.

Figure 5:
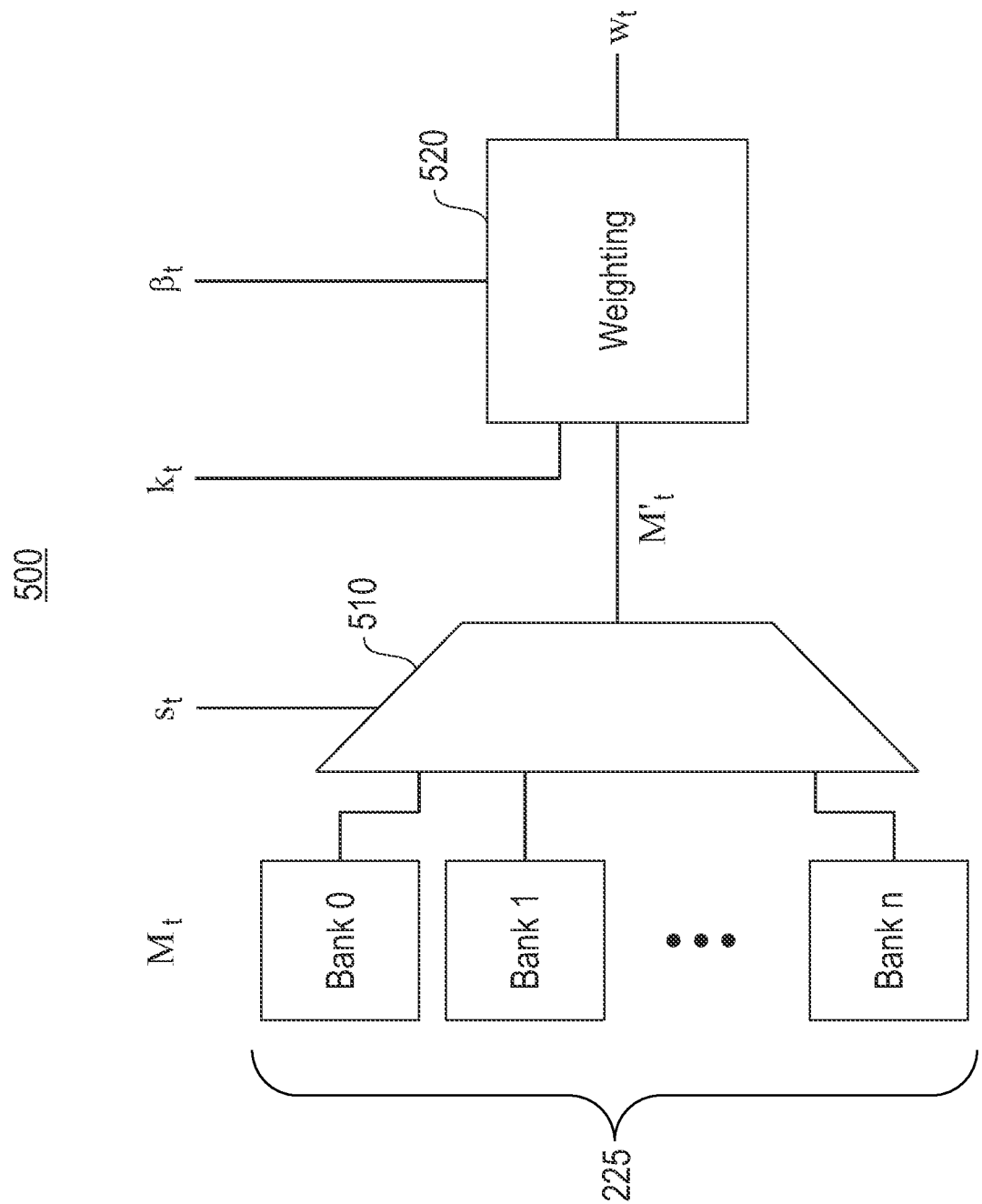
FIG. 5 depicts a block diagram of a memory address determination apparatus, according to one or more embodiments of the present invention.

FIG. 5 depicts a block diagram of a memory address determination apparatus according to one or more embodiments of the present invention. The memory address determination apparatus 500 can be used by the controller 210 to determine the memory address that is to be accessed in the distributed memory device 220. The memory address determination apparatus 500 can improve the efficiency of determining the memory address using digital logic circuit components.

The memory address determination apparatus 500 includes a selection unit 510 and a weighting unit 520. The selection unit 510 can be a multiplexer or any other component that facilitates selection of one of several inputs. In this case, the selection unit 510 is coupled with the several memory banks 225 from the distributed memory device 220. The memory bank selector 250 provides a controlling signal to the selection unit 510 to select particular memory bank(s) 225. The selected memory banks 225 are interfaced to the weighting unit 520 via the selection unit 510. The weighting unit 520 computes the weight vector using the key vector and key strength, along with the selected memory banks 225.

Figure 6:
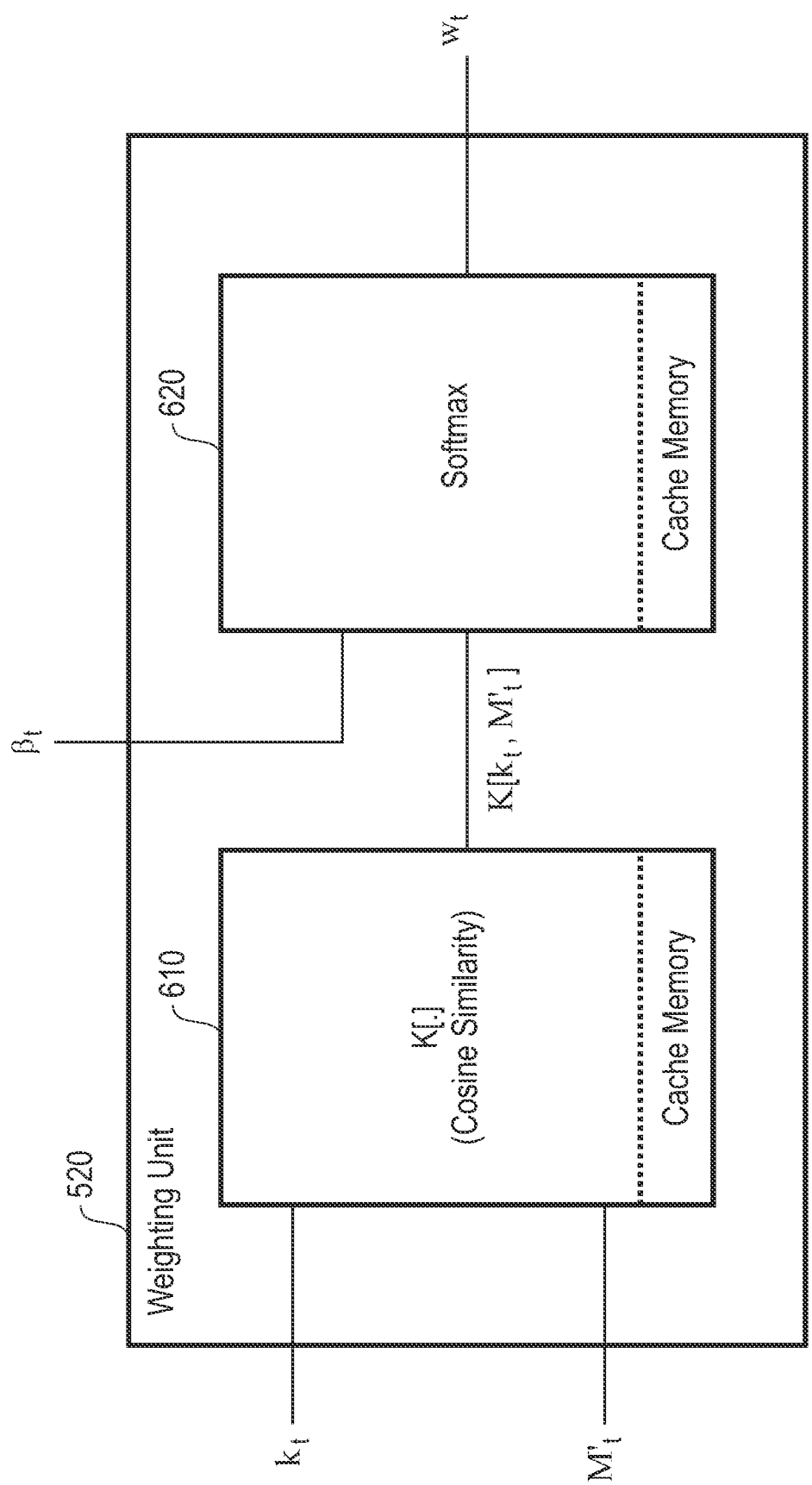
FIG. 6 depicts a block diagram of a weighting unit, according to one or more embodiments of the present invention.

FIG. 6 depicts a block diagram of a weighting unit 520 according to one or more embodiments of the present invention. The weighting unit 520 includes a similarity computation unit 610 and a softmax computation unit 620. Each unit can include respective cache memories in one or more embodiments of the present invention. The similarity computation unit 610 computes a similarity function K between the key vector and the selected memory banks 225 that are interfaced via the selection unit 510. The similarity function can be a cosine similarity function in one or more embodiments of the present invention, however, it is noted that other types of similarity functions can be used in other embodiments.

Figure 7:
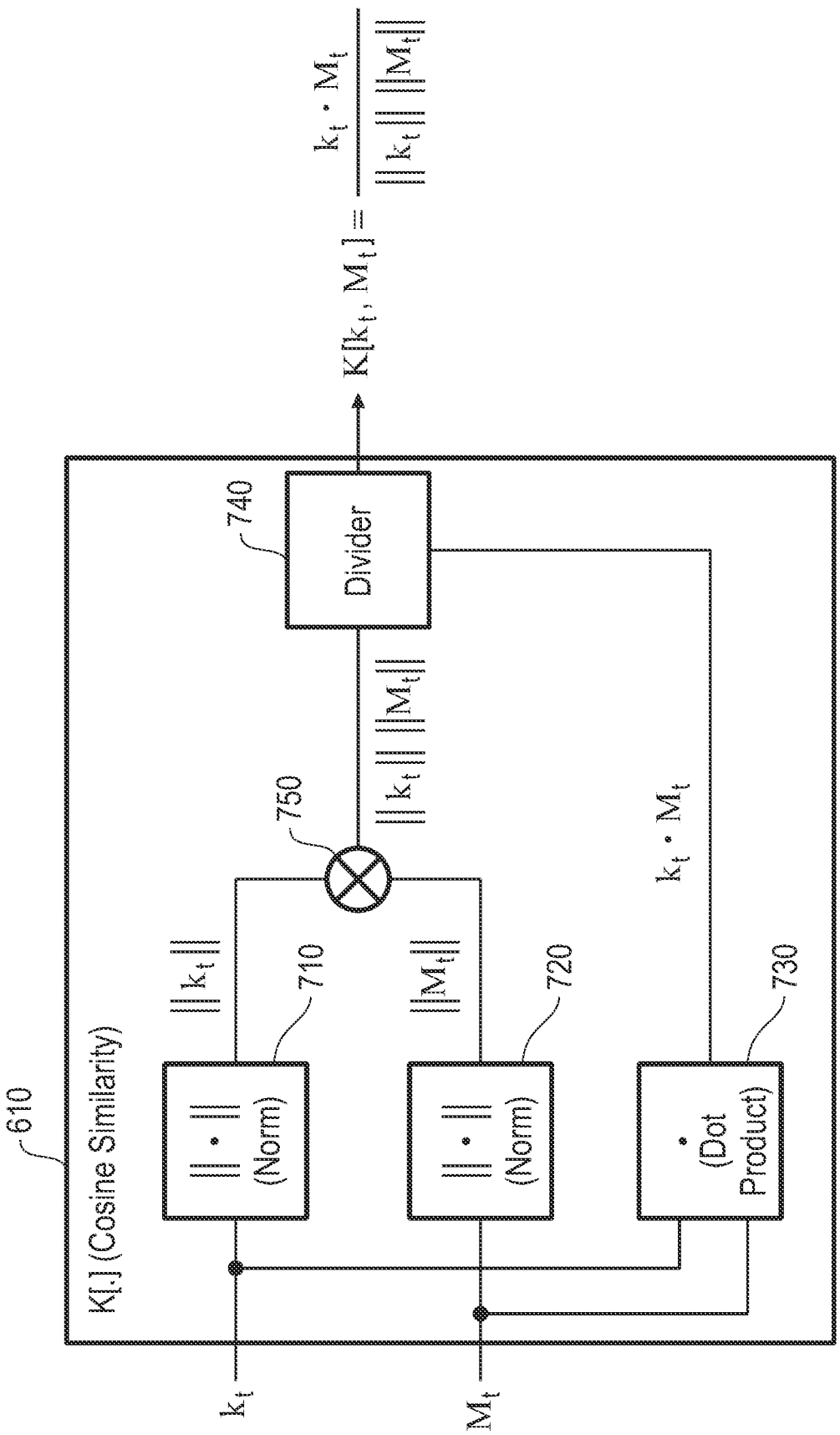
FIG. 7 depicts a block diagram of a cosine similarity function computation unit, according to one or more embodiments of the present invention.

FIG. 7 depicts a block diagram of a cosine similarity function computation unit according to one or more embodiments of the present invention. The input signals, the key vector and the vector of selected memory banks are fed into respective norm units 710 and 720. The norm units perform "normalization", which is a standard procedure that takes a vector of values and divides it by the sum of its values. As a result, values of the resulting vector are normalized, i.e., sum to one. In one or more embodiments of the present invention, the values of the vectors are provided sequentially, one value from each vector per clock cycle. For each clock cycle, the norm units 710 and 720 accumulate the result from previous cycles and the present cycle. The norm is calculated and a valid output is provided by each norm unit 710, 720 after the last value of the input vector is received. The length of the vectors is predetermined and hence, the last value can be determined. The normalized outputs are multiplied by a multiplier 750, and the result is provided as a denominator to a divider 740.

Further, the cosine similarity function computation unit 620 includes a dot product unit 730 that computes a dot product of the key vector and the vector of selected memory banks. The dot product unit 730 has a similar behavior, where, at each clock cycle, two inputs (a value of the key vector $k_t$ and a value of the vector $M_t$) are provided. Internally, during the same clock cycle, these inputs are multiplied and accumulated by the dot product unit 730.

After the last two inputs are provided, the accumulated value becomes a valid output and is fed into the divider, as a numerator.

When the inputs of the divider 740 are valid, the divider 740 divides the numerator with the denominator, the result of which is the cosine similarity $K[k_t, M_t]$.

Referring again to FIG. 6, the output of the similarity computation unit 610 is used by the softmax computation unit 620 to compute the weight vector that is used as the memory address. The softmax computation unit 620 further receives the key strength parameter for computing the weight vector.

Figure 8:
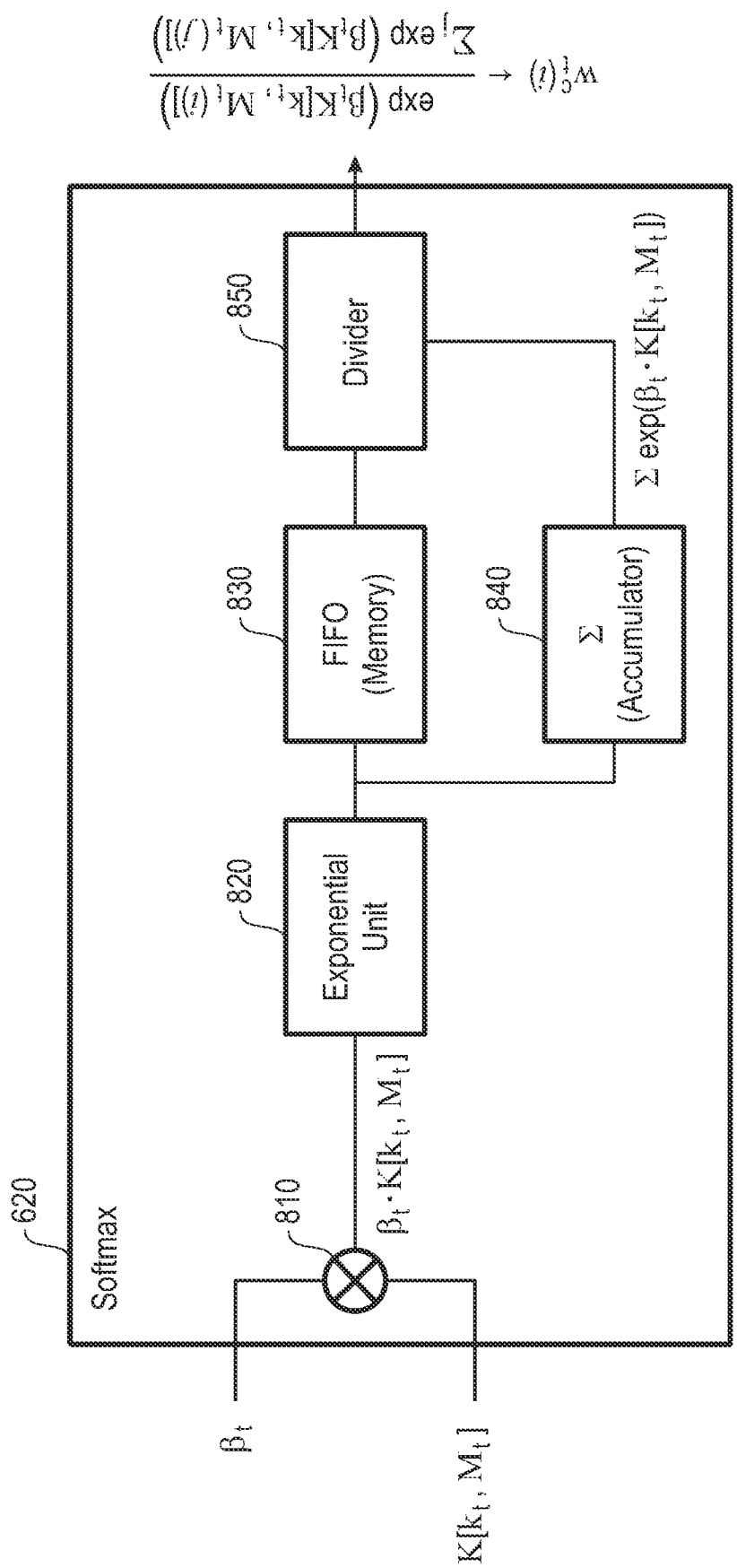
FIG. 8 depicts a block diagram of a softmax computation unit, according to one or more embodiments of the present invention.

FIG. 8 depicts a block diagram of a softmax computation unit according to one or more embodiments of the present invention. The softmax computation unit 620 receives the cosine similarity $K[k_t, M_t]$, which is a vector where each value is provided sequentially on arbitrary clock cycle. A check for valid signal (not represented) is attached to the cosine similarity input to determine that the cosine similarity signal contains data or not. Further, the softmax computation unit 620 receives the parameter Pt. A multiplier 810 computes a multiplication of $\beta_t$ and the cosine similarity vector. The resulting value goes into an exponential unit 820. In one or more embodiments of the present invention, the exponential unit 820 can be a CORDIC, or any other known unit for computing exponential. The output signal of the exponential unit 820 is a vector but only one value is output per clock cycle. Each output value is stored in a memory 830, such as a first-in, first-out (FIFO) and is simultaneously accumulated in an accumulator unit 840. When the last value of the vector of the exponential unit 820 is output, the accumulated value becomes valid and is locked for computing a division for each value stored in the memory 830. When the accumulator 840 is locked, the memory 830 delivers the stored values sequentially, one value per clock cycle to a divider 850. The divider 850 divides each of the values input from the memory 830 by the accumulated sum from the accumulator unit 840. The output of the divider 850 is the weighting vector. The values of the weighting vector are provided sequentially, one value per clock cycle, as the stored values from the memory 830 are received.

Embodiments of the present invention facilitate a MANN system to distribute content across several memory banks, and accordingly allowing the MANN system to have a larger storage capacity than in existing systems. Embodiments of the present invention determine a memory bank selector, which is a trainable parameter that a controller of the MANN system learns using neural network training technique(s). The memory bank selector can select one or more memory banks. Further, as described herein, in embodiments of the present invention, the query key and memory matrix are compared after the memory bank selection. This limits the similarity operation to be performed with a much smaller size memory (e.g., 1 bank), than the entire memory, and accordingly increases computational efficiency.

Figure 9:
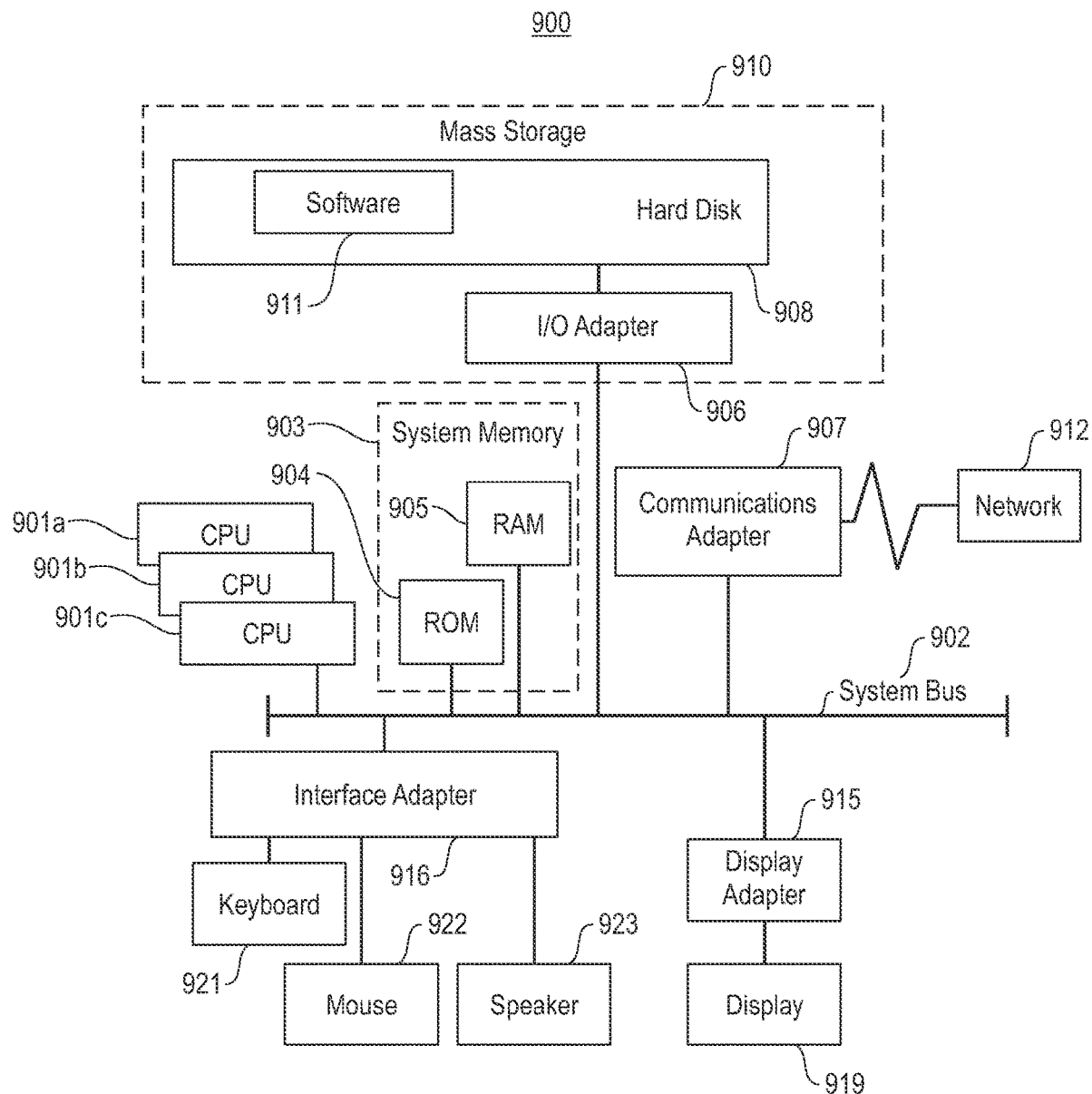
FIG. 9 depicts a computer system, according to one or more embodiments of the present invention.

Turning now to FIG. 9, a computer system 900 is generally shown in accordance with an embodiment. The computer system 900 can be used to implement the controller 210, for example, among other components of the MANN 200. The computer system 900 can be an electronic, computer framework comprising and/or employing any number and combination of computing devices and networks utilizing various communication technologies, as described herein. The computer system 900 can be easily scalable, extensible, and modular, with the ability to change to different services or reconfigure some features independently of others. The computer system 900 may be, for example, a server, desktop computer, laptop computer, tablet computer, or smartphone. In some examples, computer system 900 may be a cloud computing node. Computer system 900 may be described in the general context of computer system executable instructions, such as program modules, being executed by a computer system. Generally, program modules may include routines, programs, objects, components, logic, data structures, and so on that perform particular tasks or implement particular abstract data types. Computer system 900 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, the computer system 900 has one or more central processing units (CPU(s)) 901a, 901b, 901c, etc. (collectively or generically referred to as processor(s) 901). The processors 901 can be a single-core processor, multi-core processor, computing cluster, or any number of other configurations. The processors 901, also referred to as processing circuits, are coupled via a system bus 902 to a system memory 903 and various other components. The system memory 903 can include a read only memory (ROM) 904 and a random access memory (RAM) 905. The ROM 904 is coupled to the system bus 902 and may include a basic input/output system (BIOS), which controls certain basic functions of the computer system 900. The RAM is read-write memory coupled to the system bus 902 for use by the processors 901. The system memory 903 provides temporary memory space for operations of said instructions during operation. The system memory 903 can include random access memory (RAM), read only memory, flash memory, or any other suitable memory systems.

The computer system 900 comprises an input/output (I/O) adapter 906 and a communications adapter 907 coupled to the system bus 902. The I/O adapter 906 may be a small computer system interface (SCSI) adapter that communicates with a hard disk 908 and/or any other similar component. The I/O adapter 906 and the hard disk 908 are collectively referred to herein as a mass storage 910.

Software 911 for execution on the computer system 900 may be stored in the mass storage 910. The mass storage 910 is an example of a tangible storage medium readable by the processors 901, where the software 911 is stored as instructions for execution by the processors 901 to cause the computer system 900 to operate, such as is described herein below with respect to the various Figures. Examples of computer program product and the execution of such instruction is discussed herein in more detail. The communications adapter 907 interconnects the system bus 902 with a network 912, which may be an outside network, enabling the computer system 900 to communicate with other such systems. In one embodiment, a portion of the system memory 903 and the mass storage 910 collectively store an operating system, which may be any appropriate operating system, such as the z/OS or AIX operating system from IBM Corporation, to coordinate the functions of the various components shown in FIG. 9.

Additional input/output devices are shown as connected to the system bus 902 via a display adapter 915 and an interface adapter 916 and. In one embodiment, the adapters 906, 907, 915, and 916 may be connected to one or more I/O buses that are connected to the system bus 902 via an intermediate bus bridge (not shown). A display 919 (e.g., a screen or a display monitor) is connected to the system bus 902 by a display adapter 915, which may include a graphics controller to improve the performance of graphics intensive applications and a video controller. A keyboard 921, a mouse 922, a speaker 923, etc. can be interconnected to the system bus 902 via the interface adapter 916, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 9, the computer system 900 includes processing capability in the form of the processors 901, and, storage capability including the system memory 903 and the mass storage 910, input means such as the keyboard 921 and the mouse 922, and output capability including the speaker 923 and the display 919.

In some embodiments, the communications adapter 907 can transmit data using any suitable interface or protocol, such as the internet small computer system interface, among others. The network 912 may be a cellular network, a radio network, a wide area network (WAN), a local area network (LAN), or the Internet, among others. An external computing device may connect to the computer system 900 through the network 912. In some examples, an external computing device may be an external webserver or a cloud computing node.

It is to be understood that the block diagram of FIG. 9 is not intended to indicate that the computer system 900 is to include all of the components shown in FIG. 9. Rather, the computer system 900 can include any appropriate fewer or additional components not illustrated in FIG. 9 (e.g., additional memory components, embedded controllers, modules, additional network interfaces, etc.). Further, the embodiments described herein with respect to computer system 900 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source-code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instruction by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other devices to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

What is claimed is:

1. A computer-implemented method, comprising:
    receiving, by a controller neural network, an input;
    generating, by the controller neural network, parameters including (i) a key vector and (ii) a selector vector to interface with a plurality of memory banks that are in communication with the controller neural network via a memory subsystem;
    selecting, by the memory subsystem, at least one of the memory banks for the controller neural network to access, using the selector vector and the key vector; and
    accessing, by the controller neural network, a memory address from the selected memory bank using the key vector.

2. The computer-implemented method of claim 1, wherein one or more of the memory banks, the subsystem, and the controller neural network comprise field programmable gate array (FPGA) devices.

3. The computer-implemented method of claim 1, wherein the accessing the memory address from the selected memory bank comprises:
    generating a memory query vector by reading data from the selected memory bank;
    determining a similarity metric between the input with the memory query vector; and
    determining the memory address based on the similarity metric.

4. The computer-implemented method of claim 1, wherein the selector vector is generated based on training and/or the input.

5. The computer-implemented method of claim 1, wherein the selector vector produces at least one of the following: preferred biases, circuit timings, stability and/or write assist parameters for the memory banks.

6. The computer-implemented method of claim 1, wherein the memory banks are in a distributed memory device and are heterogeneous, with a first memory bank in the distributed memory device having attributes that are distinct from those of a second memory bank in the distributed memory device.

7. The computer-implemented method of claim 1, wherein the memory banks are in a distributed memory device and are homogenous, with the memory banks having substantially same attributes.

8. A neural network system, comprising:
a distributed memory device comprising a plurality of memory banks; and
a controller coupled with the distributed memory device, to access data stored in the distributed memory device, the controller configured to:
in response to an input, generate parameters including (i) a key vector and (ii) a selector vector to interface with the plurality of memory banks;
select, at least one of the memory banks for the controller neural network to access, using the selector vector and the key vector; and
access a memory address from the selected memory bank using the key vector.

9. The system of claim 8, wherein one or more of the memory banks, the distributed memory device, and the controller neural network comprise field programmable gate array (FPGA) devices.

10. The system of claim 8, wherein the accessing the memory address from the selected memory bank comprises:
generating a memory query vector by reading data from the selected memory bank;
determining a similarity metric between the input with the memory query vector; and
determining the memory address based on the similarity metric.

11. The system of claim 8, wherein the selector vector is generated based on training and/or the input.

12. The system of claim 8, wherein the selector vector produces at least one of the following: preferred biases, circuit timings, stability and/or write assist parameters for the memory banks.

13. The system of claim 8, wherein the memory banks are in a distributed memory device and are heterogeneous, with a first memory bank in the distributed memory device having attributes that are distinct from those of a second memory bank in the distributed memory device.

14. The system of claim 8, wherein the memory banks are in a distributed memory device and are homogenous, with the memory banks having substantially same attributes.

15. A memory address determination apparatus, comprising:
a controller configured to access data stored in a distributed memory device, the controller further configured to:
in response to an input, generate parameters including (i) a key vector and (ii) a selector vector to interface with the plurality of memory banks;
select, at least one of the memory banks for the controller neural network to access, using the selector vector and the key vector; and
access a memory address from the selected memory bank using the key vector.

16. The memory address determination apparatus of claim 15, wherein the accessing the memory address from the selected memory bank comprises:
generating a memory query vector by reading data from the selected memory bank;
determining a similarity metric between the input with the memory query vector; and
determining the memory address based on the similarity metric.

17. The memory address determination apparatus of claim 15, wherein the selector vector is generated based on training and/or the input.

18. The memory address determination apparatus of claim 15, wherein the selector vector produces at least one of the following: preferred biases, circuit timings, stability and/or write assist parameters for the memory banks.

19. The memory address determination apparatus of claim 15, wherein the memory banks are in a distributed memory device and are heterogeneous, with a first memory bank in the distributed memory device having attributes that are distinct from those of a second memory bank in the distributed memory device.

20. The memory address determination apparatus of claim 15, wherein the memory banks are in a distributed memory device and are homogenous, with the memory banks having substantially same attributes.

* * * * *